United States Patent [19]

Aoyama et al.

[11] Patent Number: 5,538,832
[45] Date of Patent: Jul. 23, 1996

[54] DEVELOPING SOLUTION FOR PRODUCING PRINTED CIRCUIT BOARDS AND A PROCESS FOR PRODUCING PRINTED CIRCUIT BOARDS WHEREIN THE DEVELOPING SOLUTION COMPRISES A QUATERNARY AMMONIUM HYDROXIDE AND A QUATERNARY AMMONIUM CARBONATE

[75] Inventors: Tetsuo Aoyama, Niigata; Takeshi Nagasaka; Toshihiko Kobayashi, both of Tokorozawa; Naohito Yoshimura, Tokyo; Takashi Nakata, Tokyo; Youichi Takizawa, Tokyo, all of Japan

[73] Assignee: Mitsubishi Gas Chemical Company, Inc., Tokyo, Japan

[21] Appl. No.: 347,889

[22] Filed: Dec. 1, 1994

[30] Foreign Application Priority Data

Dec. 16, 1993 [JP] Japan ................................. 5-316765
Feb. 9, 1994 [JP] Japan ................................. 6-015289

[51] Int. Cl.$^6$ .................................. G03F 7/30; G03F 7/32
[52] U.S. Cl. .................... 430/314; 430/281.1; 430/313; 430/315; 430/331
[58] Field of Search .................................. 430/331, 313, 430/314, 315, 281.1

[56] References Cited

U.S. PATENT DOCUMENTS

| | | | |
|---|---|---|---|
| 4,606,999 | 8/1986 | Poulin et al. | 430/331 |
| 4,729,941 | 3/1988 | Itoh et al. | 430/331 |
| 4,741,989 | 5/1988 | Niwa et al. | 430/331 |
| 4,784,937 | 11/1988 | Tanaka et al. | 430/331 |
| 4,873,177 | 10/1989 | Tanaka et al. | 430/331 |
| 5,053,318 | 10/1991 | Gulla et al. | 430/315 |
| 5,175,078 | 12/1992 | Aoyama et al. | 430/331 |
| 5,422,223 | 6/1995 | Sachdev et al. | 430/313 |

*Primary Examiner*—John S. Y. Chu
*Attorney, Agent, or Firm*—Frishauf, Holtz, Goodman, Langer & Chick

[57] ABSTRACT

A developing solution comprising a specific amount of a quaternary ammonium hydroxide represented by the general formula $[(R^1)_3N-R]^+ \cdot OH^-$ (R indicates an alkyl group having 1 to 3 carbon atoms or a hydroxy-substituted alkyl group having 1 to 3 carbon atoms, and $R^1$ indicates an alkyl group having 1 to 3 carbon atoms) and, if necessary, a quaternary ammonium hydrogen carbonate represented by the general formula $[(R^1)_3N-R]^+ \cdot HCO_3^-$ (R and $R^1$ are the same as the above) and having a pH in the range of 9 to 13, and a process for producing printed circuit boards using an organic alkali solution, are provided. The developing solution needs no defoaming agent because it causes little foaming. Printed circuit boards produced by using the developing solution have excellent finished accuracy. Therefore, fine circuits of printed circuit networks can be produced with stability.

14 Claims, No Drawings

DEVELOPING SOLUTION FOR PRODUCING PRINTED CIRCUIT BOARDS AND A PROCESS FOR PRODUCING PRINTED CIRCUIT BOARDS WHEREIN THE DEVELOPING SOLUTION COMPRISES A QUATERNARY AMMONIUM HYDROXIDE AND A QUATERNARY AMMONIUM CARBONATE

BACKGROUND OF THE INVENTION

1. Field of the Invention

The present invention relates to a developing solution (a developer) for producing printed circuit boards and a process for producing printed circuit boards. More particularly, the present invention relates to a developing solution for producing printed circuit boards which comprises a quaternary ammonium hydroxide or a quaternary ammonium hydroxide and a quaternary ammonium hydrogen carbonate, and a process for producing printed circuit boards comprising adhering a resist of the photo-curing type on a board, exposing the resist to ultraviolet light through a photomask, developing an exposed resist by using the alkaline developing solution and forming a plating resist circuit or an etching resist circuit.

2. Description of the Related Arts

Circuit processing of printed circuit boards in recent years has become finer in parallel with the progress of surface mounting of mounted parts. Even so called circuits of five lines between pins in which five signal lines are placed between through-holes on the base grid have been designed.

In this case, it is required in the design that the signal width and the distance are both 0.08 mm. A process for producing such fine circuits with stability has been desired.

As the plating resist and the etching resist, photo-resists of the photo-curing type having a thin-film structure have been recently developed for the purpose of forming fine circuits and attracting attention. Adhesion of a photo-resist by the electro-deposition method is also attracting attention. Photo-resists of the dry film-type have been improved in recent years so that they can be applied to forming fine circuit boards.

For all these types of photo-resist, an aqueous solution of sodium carbonate is generally used as the developing solution in the development process.

In the development of a photo-resist, saponification between the resist and an alkali proceeds as the photo-resist is dissolved into the developing solution and foaming of the developing solution is increased to cause trouble in the developing apparatus. Therefore, it is the real situation at present that a defoaming agent containing an oil component such as silicone oil as the main component thereof is added to suppress the foaming of the developing solution.

However, such additives (defoaming agents) are expensive. Furthermore, insoluble substances are formed in the developing solution when such defoaming agents are used and big problems arise for forming a circuit, particularly in the case of the plating resist and the etching resist.

When a developing solution containing sodium carbonate is used, a washing treatment with water is conducted for removing water containing alkaline substances which remains on the printed circuit board after the development with sodium carbonate is finished. However, the removal of the alkaline substances is very difficult. The developing apparatuses currently used are generally equipped with washing tanks in five stages or more for completely removing the insoluble substances.

SUMMARY OF THE INVENTION

As the result of extensive studies by the present inventors on the above-described subjects in the production of printed circuit boards, it was discovered that the foaming is suppressed without adding a defoaming agent and washing with water can be made easily when an organic alkali solution is used as the developing solution. It was also discovered by the present inventors that, when a circuit network is formed on a resist, a fine circuit network can be produced with stability by decreasing formation of substances which are insoluble in the developing solution using a specific developing solution. The present inventions have been completed on the basis of these discoveries.

The present invention has an object to provide a developing solution (developer) which enables forming fine circuits without adding a defoaming agent and causes little foaming.

The present invention has another object to provide a stable and efficient process for producing printed circuit boards by which a washing process with water for removing insoluble substances is simplified, finished accuracy of the printed circuit boards is increased, and defect rate is remarkably decreased.

Thus, the present invention relates to a developing solution for producing printed circuit boards comprising a quaternary ammonium hydroxide represented by the general formula: $[(R^1)_3N\text{---}R]^+ \cdot OH^-$ (R indicates an alkyl group having 1 to 3 carbon atoms or a hydroxy-substituted alkyl group having 1 to 3 carbon atoms, and $R^1$ indicates an alkyl group having 1 to 3 carbon atoms), preferably tetramethylammonium hydroxide or trimethyl(2-hydroxyethyl)ammonium hydroxide. The developing solution for producing printed circuit boards of the present invention comprises the quaternary ammonium hydroxide in an amount of 0.01 to 3.0% by weight, preferably 0.05 to 1.0% by weight and having a pH of 9 to 13.

The present invention also relates to a developing solution for producing printed circuit boards comprising the quaternary ammonium hydroxide described above and a quaternary ammonium hydrogen carbonate represented by the general formula: $[(R^1)_3N\text{---}R]^+ \cdot HCO_3^-$ (R indicates an alkyl group having 1 to 3 carbon atoms or a hydroxy-substituted alkyl group having 1 to 3 carbon atoms, and $R^1$ indicates an alkyl group having 1 to 3 carbon atoms). It is preferred that the quaternary ammonium hydroxide is comprised in an amount of 0.2 to 3.0% by weight and the quaternary ammonium hydrogen carbonate is comprised in an amount by mol equal to or more than the amount by mol of the quaternary ammonium hydroxide, and the pH of the developing solution is 9 to 13. It is more preferred that tetramethylammonium hydrogen carbonate or trimethyl(2-hydroxyethyl)ammonium hydrogen carbonate is used as the quaternary ammonium hydrogen carbonate.

The present invention further relates to a process for producing printed circuit boards comprising adhering a resist of the photo-curing type, preferably a plating resist or a photo-etching resist, on a board, exposing the resist to ultraviolet light through a photomask, developing the exposed resist by using an organic alkali solution, preferably the developing solution used for producing printed circuit boards described above, excluding a defoaming agent, and forming a circuit.

DESCRIPTION OF PREFERRED EMBODIMENTS

The developing solution for printed circuit boards of the present invention is described first in the following.

Generally in the production of printed circuit boards using the etching resist, the photo-etching resist is coated on a board treated on the surface and irradiated with ultraviolet light through a photomask which is the original plate of the circuit to photo-cure the necessary parts of the resist. The process of removing the uncured parts which are not cured by the irradiation of ultraviolet light is the development. Heretofore, an aqueous solution containing 0.7 to 1.5% by weight of sodium carbonate and a defoaming agent has generally been used as the developing solution.

The present invention provides an organic alkali solution, particularly a solution of quaternary ammonium hydroxide, as the developing solution used in place of the conventional aqueous sodium carbonate solution.

The quaternary ammonium hydroxide used in the present invention is represented by the general formula: $[(R^1)_3N-R]^+ \cdot OH^-$, wherein R indicates an alkyl group having 1 to 3 carbon atoms or a hydroxy-substituted alkyl group having 1 to 3 carbon atoms, and $R^1$ indicates an alkyl group having 1 to 3 carbon atoms. Examples of the quaternary ammonium hydroxide include tetramethylammonium hydroxide, tetraethylammonium hydroxide, tetrapropylammonium hydroxide, trimethylethylammonium hydroxide, dimethyldiethylammonium hydroxide, triethylmethylammonium hydroxide, trimethyl(2-hydroxyethyl)ammonium hydroxide, and triethyl(2-hydroxyethyl)ammonium hydroxide. Among these quaternary ammonium hydroxides, tetramethylammonium hydroxide and trimethyl(2-hydroxyethyl)ammonium hydroxide are particularly preferably used.

The developing solution of the present invention is a developing solution comprising a quaternary ammonium hydroxide. The concentration of the quaternary ammonium hydroxide is preferably 0.01 to 3.0% by weight, more preferably 0.05 to 1.0% by weight, and most preferably 0.1 to 0.5% by weight. The pH of the developing solution is preferably in the range of 9 to 13. The temperature of the developing solution in the development is 20° to 40° C., preferably 25° to 35° C.

When the concentration of the quaternary ammonium hydroxide in the production of printed circuit boards is higher than 3.0% by weight, adhesion of the photo-resist irradiated with ultraviolet light is decreased at the irradiated parts and the etching-resist on the fine circuit flows. Therefore, processing of the fine circuit cannot be made. When the concentration of the quaternary ammonium hydroxide is lower than 0.01% by weight, incomplete removal of the uncured photo-etching resist occurs and causes formation of defect products having breaks in the circuit.

When the developing solution of the present invention described above is used, addition of a defoaming agent is not necessary in the production of printed circuit boards and amount of insoluble substances in the developing solution is decreased.

When the aqueous solution of the quaternary ammonium hydroxide is used as the developing solution, the concentration of the alkali is low and occasionally the concentration of the alkali in the developing solution is further decreased as the photo-resist is dissolved. In this case, the life of the developing solution can be extended by adding the consumed amount of the quaternary ammonium hydroxide. However, fluctuation of the pH of the developing solution occurs to a larger degree and more careful control of the concentration is required.

As a method for easier control of the concentration, stabilization of pH by increasing concentration of the alkali species and adding a buffer solution is effective.

As the buffer solution, a solution of a quaternary ammonium hydrogen carbonate is preferably used. A quaternary ammonium hydrogen carbonate can be obtained by converting the corresponding quaternary ammonium hydroxide in the developing solution into the quaternary hydrogen carbonate. However, a developing solution prepared by adding a quaternary ammonium hydrogen carbonate is more advantageous because of easier handling and lower cost.

The quaternary ammonium hydrogen carbonate used in the present invention is represented by the general formula: $[(R^1)_3N-R]^+ \cdot HCO_3^-$, wherein R indicates an alkyl group having 1 to 3 carbon atoms or a hydroxy-substituted alkyl group having 1 to 3 carbon atoms, and $R^1$ indicates an alkyl group having 1 to 3 carbon atoms. Examples of the quaternary ammonium hydrogen carbonate include tetramethylammonium hydrogen carbonate, tetraethylammonium hydrogen carbonate, tetrapropylammonium hydrogen carbonate, trimethylethylammonium hydrogen carbonate, dimethyldiethylammonium hydrogen carbonate, triethylmethylammonium hydrogen carbonate, trimethyl(2-hydroxyethyl)ammonium hydrogen carbonate, and triethyl(2-hydroxyethyl)ammonium hydrogen carbonate. Among these quaternary ammonium hydrogen carbonates, tetramethylammonium hydrogen carbonate and trimethyl(2-hydroxyethyl)ammonium hydrogen carbonate are particularly preferably used.

In the developing solution comprising a mixture of the quaternary ammonium hydroxide and the quaternary ammonium hydrogen carbonate, the concentration of the quaternary ammonium hydroxide is preferably 0.2 to 3.0% by weight, more preferably 0.5 to 2.5% by weight. The concentration by mol of the quaternary ammonium hydrogen carbonate is preferably equal to or more than the concentration by tool of the quaternary ammonium hydroxide. In this condition of the concentrations, the pH of the developing solution can be adjusted to 9.0 to 13.0, preferably 9.0 to 11.0 and the development can be made with stability.

The developing solution for printed circuit boards of the present invention has little tendency for foaming and use of a defoaming agent in the process for producing printed circuit boards is not necessary. Therefore, the amount of insoluble substances in the developing solution is decreased and the finished accuracy of the printed circuit boards is increased to result in a remarkable decrease in the defect rate. Furthermore, the developing solution of the present invention can treat three times more printed circuit boards than the conventional aqueous solution of sodium carbonate.

The process for producing printed circuit boards of the present invention is described in the following.

As the board used for producing printed circuit boards in the present invention, a fiber reinforced composite material, such as a glass-epoxy composite, a paper-epoxy composite, a paper-phenol composite, a glass-polyimide composite, and the like, a heat-resistant resin having flexibility, such as a polyimide, Teflon, a polyester and the like, or a metal core, can be used.

As the conductive material for forming the printed circuit network, electrolytic copper foil and rolled copper foil are generally used. Foil and plate of a metal, such as an aluminum alloy, can also be used.

In the process for producing printed circuit boards of the present invention, a resist of the photo-curing type, preferably a plating resist or a photo-etching resist, is adhered (attached) to the board. After being exposed to ultraviolet light through a photomask, the resist is developed by using an organic alkali solution, preferably the developing solution for printed circuit boards described above, excluding a defoaming agent, and a circuit is formed.

When a plating resist is used in the process for producing printed circuit boards of the present invention, the board on which the printed circuit network is formed is provided with holes at the positions corresponding to the positions of the circuit, if necessary, and the surface of the board is cleaned by the mechanical polishing and the chemical polishing. Then, the whole surface of the board is coated to the thickness of about 5 to 15 μm by the non-electrolytic plating and the electrolytic copper plating in the first plating treatment. The cleaning of the surface of the board described above is performed generally by degreasing the board by dipping into a conditioner solution, treating the degreased board with the soft etching using sodium persulfate or the like, treating the board thus treated with an aqueous solution of sulfuric acid, and then washing the board with water.

After the surface of the board is activated by a Pd catalyst and an accelerator, the board is treated with the non-electrolytic plating (the chemical plating). The board treated with the non-electrolytic plating is then treated with the electrolytic plating in a copper pyrophosphate bath or in a copper sulfate bath for the purpose of increasing thickness of the copper layer and enhancing reliability.

The plating resist used in the present invention is a resist of the photo-curing type. Furthermore, it is a plating resist of the alkali developing type in which the uncured parts of the resist is removed by dissolving into an aqueous alkaline solution.

In general, the plating resist of the alkali developing type has a basic composition which comprises a copolymer composition containing an acrylic copolymer and a copolymer having carboxylic groups as the binder, and additives, such as photopolymerizable monomers like (polyfunctional) acrylate compounds having acryloyl groups, (polyfunctional) methacrylate compounds having methacryloyl groups, and the like, initiators of photopolymerization, stabilizers, coloring agents, adhesion promoters, dyestuffs, and the like.

As the method for coating the plating resist on the board, the methods for processing printed circuit networks, such as the method of heat pressing a dry film, the method of coating a liquid resist by the roll coating or the like, the method of coating by electro-deposition, the method of electro-static coating, and the like, are used. The plating resist is coated by one of such methods and irradiated with ultraviolet light through a photomask which is the original plate of the circuit to cure the necessary parts of the resist.

On the other hand, when an etching resist is used in the process for producing printed circuit boards of the present invention, the surface of the board on which the printed circuit network is formed is cleaned by mechanical polishing and chemical polishing. Then, a photo-etching resist is coated on the surface of the board and irradiated with ultraviolet light through a photomask which is the original plate of the circuit to cure the necessary parts of the resist.

The photo-etching resist used in the present invention is a resist of the photo-curing type. Furthermore, it is a photo-etching resist of the alkali developing type in which the uncured parts of the resist is removed by dissolving into an aqueous alkaline solution.

In general, the photo-etching resist of the alkali developing type has a basic composition which comprises a copolymer composition containing an acrylic copolymer and a copolymer having carboxylic groups as the binder, and additives, such as photopolymerizable monomers like (polyfunctional) acrylate compounds having acryloyl groups, (polyfunctional) methacrylate compounds having methacryloyl groups, and the like, initiators of photopolymerization, stabilizers, coloring agents, adhesion promoters, dyestuffs, and the like.

As the method for coating the photo-etching resist on the board, the methods for processing printed circuit networks, such as the method of coating a liquid resist by the roll coating or the like, the method of coating by electro-deposition, the method of electro-static coating, the dry film method, and the like, are used.

In the development process, a developing apparatus of a conveyor type is used. The developing solution described above is sprayed from a plurality of nozzles. As the nozzle for the spraying, a full cone type nozzle is generally used. However, a fan-jet type nozzle, a hollow cone type nozzle and the like may also be used.

It is desirable for forming a fine circuit network that a developing apparatus equipped with the oscillation function by which piping having nozzles (the manifold) is moved mechanically for injecting the fluid from the nozzles in such a manner that the board is coated uniformly.

The time setting of the development is different depending on the kind of the resist used and the conditions of the development. The time setting is decided according to the number obtained by dividing the effective dimension of the developing apparatus with the speed of the conveyor. As the approximate measure of the time setting of the development, the process is adjusted in such a manner that the unirradiated photo-resist is removed by passing the board having the etching resist on it through the developing solution desirably at the position of ½ to ⅔ of the effective dimension of the developing apparatus.

The board which has been treated with the developing solution is dewatered with an air knife, washed with water as quickly as possible, and then treated with the etching to form the circuit.

The treated board is then subject to the second plating treatment (the pattern plating treatment) and the circuit network of the printed circuit board is formed. For the second plating treatment, the board is degreased by dipping into a conditioner solution, and treated with the soft etching, with an aqueous solution of sulfuric acid, and then with the copper sulfate plating, similarly to the first plating treatment. The board treated with the second plating is washed with water and dried to form the circuit network of the printed circuit board. The board may be treated with the solder plating after the washing with water to form a metal resist.

When the process for producing printed circuit boards of the present invention described above is adopted, the printed circuit board produced is excellent in the finished accuracy and the washing process in the production is easily performed. Therefore, fine circuits of printed circuit network can be produced with stability. Thus, the process of the present invention has great advantages as an industrial process.

The present invention is described with reference to the examples. However, the examples are not to be construed to limit the scope of the invention.

Results of measurements and evaluations in the examples and the comparative examples are shown in Tables 1 to 6. In the tables, — indicates a result in which alkalinity of the developing solution is decreased and the dry film was not dissolved, and x indicates a result in which foaming exceeded 50 cm and operation of the development was stopped because further operation was not possible.

EXAMPLE 1

A copper-plated glass-epoxy laminate which is composed of a glass-epoxy board of 0.6 mm thickness and copper foils of 0.07 mm coated on both sidles of the board was washed with water and polished by using a buff brush polishing machine (a product of Dainippon Screen Co., Ltd.; GMP-600) equipped with a nylon brush containing alumina polishing abrasives (a product of Tsunoda Seisakusho; #1000) at the cutting speed of 9 m/sec, the foot print of 10 mm, the oscillation of 250 per minute and the conveyor speed of 3 m/min, washed with water, dried, and a clean board was obtained.

The clean board was degreased by dipping into a solution of a conditioner, XP-2122 (a product of Shiply Co.), at 50° C. for 5 minutes and washed with water. The degreased board was treated with the soft etching by using a 20% aqueous solution of sodium persulfate, then treated with a 20% aqueous solution of sulfuric acid, and washed with water. The surface of the board was activated by using a Pd catalyst (Catadeposit 44; a product of Shiply Co.) and Accelerator 19 (a product of Shiply Co.) and washed with water. The activated board was treated with the non-electrolytic plating by using a non-electrolytic copper type 385-2 (a product of Shiply Co.) at the temperature of 35° C. for 17 minutes and a copper layer of 0.3 to 0.5 µm was formed.

In the operation of the electrolytic plating, a plating bath (pH, 8.8) containing 84 g/liter of copper pyrophosphate 340 g/liter of potassium pyrophosphate and 3 cc/liter of ammonia water in the ion-exchanged water was used and a copper layer of about 20 µm was formed by treating the board at 55° C. for 25 minutes.

To the plated board thus prepared, a dry film of the alkali development type (a product of Asahi Kasei Co., Ltd.; Sunfort AQ4036; film thickness, 0.03 mm) was heat pressed by using a laminator (a product of duPont Co.; HRL-24) in the condition of the roll temperature of 110° C., the pressure of 2.0 kgf/cm$^2$, and the conveyor speed of 1.5 m/min, and a laminate board was obtained.

The circuit network to be formed on the laminate board had a test pattern (L) for testing signal lines in which lines having widths of 0.025, 0.05, 0.075 and 0.10 mm were arrange with the distance to the adjacent lines of 0.50 mm and a test pattern (S) for testing the distance between the lines in the pattern which is obtained by inversion of the pattern (L). Ultraviolet light was irradiated on the laminate board through a negative film made of a polyester on which a printed circuit having test patterns obtained by inversion of the test patterns described above is printed and an exposed board was obtained.

The developing apparatus used for the development had a horizontal arrangement and was equipped with sprays arranged on both sides of a conveyor so that the developing solution can be sprayed to the surface of the board at the constant pressure.

A 0.15% aqueous solution of tetramethylammonium hydroxide was charged to the developing apparatus and the exposed board described above was treated in the condition of 25° C. The treated board was dewatered by an air knife attached to the developing apparatus, washed with water, dried and treated with etching, to make ready for the second plating treatment.

In the second plating treatment (the operation of pattern plating), the board having the developed photo-resist was degreased with Enplate PC-455 (a product of Meltex Co.) and treated by etching with a 20% sodium persulfate. After dipping into a 15% aqueous solution of sulfuric acid for 1.5 minutes, the board was treated with copper sulfate plating at the cell voltage of 1 to 2 V for 25 minutes by using a plating bath containing 75 g/liter of copper sulfate, 190 g/liter of sulfuric acid, and 75 mg/liter of chlorine ion in the ion-exchanged water, washed with water and then dried.

The finished accuracy of the fine circuit after the second plating treatment was evaluated by finding the minimum width of the conductive material (width L) and the minimum distance between the conductive materials (distance S) which can be processed to form a circuit network.

After the exposed board had been treated, the dry film described above (a product of Asahi Kasei Co., Ltd.; Sunfort AQ4036) was dissolved into the developing solution in such a manner that concentration of the dissolved dry film is adjusted to 0.08 m$^2$/liter and foaming height of the surface of the developing solution in the tank of the developing apparatus was measured.

Results are shown in Table 1.

A sample of the developing solution in an amount of 100 ml was taken out, filtered by filter paper and weight of substances remaining on the filter paper was measured.

Results are shown in Table 2.

The exposed board described above was treated and etched and finished accuracy of the fine circuit was evaluated by finding the minimum width of the conductive material (width L) and the minimum distance between the conductive materials (distance S) which can be processed to form a circuit network.

Results are shown in Table 3.

EXAMPLE 2

The exposed board which is the same as that in Example 1 was treated by the same process as that in Example 1 except that the concentration of the aqueous solution of tetramethylammonium hydroxide in the developing solution was increased to 2.0% and a 3.0% aqueous solution of tetramethylammonium hydrogen carbonate containing the same amount of the carbonate as that of the hydroxide was added to the developing solution to form a mixed developing solution. The foaming height of the developing solution and weight of substances remaining on the filter paper per 1 liter of the developing solution were measured, and finished accuracy of the fine circuit after the exposed board was treated and etched as described above was evaluated by finding the minimum width of the conductive material (width L) and the minimum distance between the conductive materials (distance S) which can be processed to form a circuit network, according to the same methods described above.

Then, the dry film was dissolved into the developing solution in such a stepwise manner that the amount of the dry film in the developing solution was increased by 0.08 m$^2$/liter in every addition of the dry film. The measurements and the evaluations described above were conducted after every addition of the dry film according to the same methods as described above.

Results of the measurements and the evaluations are shown in Tables 1, 2 and 3.

The area of the printed circuit board for the treatment was 100 m$^2$ and pH of water in the first washing tank with water was 8.0. Therefore, washing with water after the second plating treating was sufficient after 3 stages of the washing.

COMPARATIVE EXAMPLE 1

A printed circuit board was prepared and evaluations were made according to the same process as that in Example 1 except that a 1.0% aqueous solution of sodium carbonate was used in place of the aqueous solution of tetramethylammonium hydroxide. When the amount of the dry film dissolved in the developing solution was increased to more than 0.03 m²/liter, foaming height of the developing solution in the tank of the developing apparatus exceeded 50 cm and the developing solution overflew out of the developing apparatus. Therefore, the experiment was stopped at this time.

COMPARATIVE EXAMPLE 2

A defoaming agent (a product of Nikka Kagaku Co., Ltd.; W-2369) was added to the developing solution used in Comparative Example 1 in an amount of 0.1% and an exposed board was treated by the same process as that in Example 1. The foaming height of the developing solution and the weight of insoluble substances remaining on the filter paper per 1 liter of the developing solution after the filtration were measured in every step of dissolving the dry film into the developing solution. The finished accuracy of the fine circuit after the exposed board was treated and etched as described above was evaluated by finding the minimum width of the conductive material (width L) and the minimum distance between the conductive materials (distance S) which can be processed to form a circuit network, according to the same methods described above.

Results of the measurements and the evaluations are shown in Tables 1, 2 and 3.

The area of the printed circuit board for the treatment was 100 m² and pH of water in the first washing tank with water was 8.0. Therefore, washing with water after the second plating treating required 6 stages of the washing.

TABLE 1

| amount of dissolved | foaming height of developing solution (mm) | | | |
|---|---|---|---|---|
| DFR (m²/liter) | 0 | 0.08 | 0.16 | 0.25 |
| Example 1 | 0 | 8 | — | — |
| Example 2 | 0 | 9 | 10 | 13 |
| Comparative Example 1 | 0 | x | x | x |
| Comparative Example 2 | 0 | 5 | 8 | 20 |

TABLE 2

| amount of dissolved | weight of substances remaining after filtration of developing solution (mg/liter) | | | |
|---|---|---|---|---|
| DFR (m²/liter) | 0 | 0.08 | 0.16 | 0.25 |
| Example 1 | 0 | 130 | — | — |
| Example 2 | 0 | 140 | 210 | 260 |
| Comparative Example 1 | 0 | x | x | x |
| Comparative Example 2 | 0 | 280 | 650 | 1900 |

TABLE 3

| amount of dissolved | | finished accuracy of development (mm) | | | |
|---|---|---|---|---|---|
| DFR (m²/liter) | | 0 | 0.08 | 0.16 | 0.25 |
| Example 1 | width L | 0.075 | 0.075 | — | — |
| | distance S | 0.075 | 0.075 | — | — |
| Example 2 | width L | 0.075 | 0.075 | 0.075 | 0.075 |
| | distance S | 0.075 | 0.075 | 0.075 | 0.075 |
| Comparative Example 1 | width L | 0.075 | x | x | x |
| | distance S | 0.075 | x | x | x |
| Comparative Example 2 | width L | 0.075 | 0.075 | 0.075 | 0.075 |
| | distance S | 0.075 | 0.075 | 0.100 | 0.125 |

EXAMPLE 3

A copper-plated glass-epoxy laminate which is composed of a glass-epoxy board of 0.6 mm thickness and copper foils of 0.07 mm coated on both sides of the board was polished on the copper surfaces by using a buff brush polishing machine (a product of Dainippon Screen Co., Ltd.; GMP-600) equipped with a nylon brush containing alumina polishing abrasives (a product of Kakuta Seisakusho, #600), washed with water, dried, and a clean board was obtained.

To the board thus prepared, a dry film of the alkali development type (a product of Asahi Kasei Co., Ltd.; Sunfort AQ3065) was laminated and a laminate board before exposure was obtained.

The circuit network to be formed on the laminate board had a test pattern (L) for testing signal lines in which lines having widths of 0.025, 0.05, 0.075 and 0.10 mm were arrange with the distance to the adjacent lines of 0.50 mm and a test pattern (S) for testing the distance between the lines in the pattern which is obtained by inversion of the pattern (L). Ultraviolet light was irradiated on the laminate board through a negative film made of a polyester on which a printed circuit having test patterns obtained by inversion of the test patterns described above is printed and an exposed board was obtained.

The developing apparatus used for the development had a horizontal arrangement and was equipped with sprays arranged on both sides of a conveyor so that the developing solution can be sprayed to the surface of the board at the constant pressure.

An apparatus for washing with water and an apparatus for etching were placed in a series arrangement so that the board treated in the developing apparatus was dewatered by an air knife attached to the developing apparatus, washed with water, dried and treated with etching with a etching solution of ferric chloride.

A 0.15% aqueous solution of tetramethylammonium hydroxide was charged to the developing apparatus described above and the exposed board described above was treated in the condition of 25° C. The finished accuracy of the fine circuit after the etching treatment was evaluated by finding the minimum width of the conductive material (width L) and the minimum distance between the conductive materials (distance S) which can be processed to form a circuit network.

After the exposed board had been treated, the dry film described above (a product of Asahi Kasei Co., Ltd.; AQ4036) was dissolved into the developing solution in such a manner that the concentration of the dissolved dry film is adjusted to 0.08 m²/liter and foaming height of the surface of the developing solution in the tank of the developing apparatus was measured.

Results are shown in Table 4.

A sample of the developing solution in an amount of 100 ml was taken out, filtered by filter paper and weight of substances remaining on the filter paper was measured.

Results are shown in Table 5.

The exposed board described above was treated and the etched and finished accuracy of the fine circuit was evaluated by finding the minimum width of the conductive material (width L) and the minimum distance between the conductive materials (distance S) which can be processed to form a circuit network.

Results are shown in Table 6.

EXAMPLE 4

The exposed board which is the same as that in Example 3 was treated by the same process as that in Example 3 except that the concentration of the aqueous solution of tetramethylammonium hydroxide in the developing solution was increased to 2.0% and a 3.0% aqueous solution of tetramethylammonium hydrogen carbonate containing the same amount of the carbonate as that of the hydroxide was added to the developing solution to form a mixed developing solution. The foaming height of the developing solution and weight of substances remaining on the filter paper per 1 liter of the developing solution were measured in every step of dissolving the dry film, and the finished accuracy of the fine circuit after the exposed board was treated and etched as described above was evaluated by finding the minimum width of the conductive material (width L) and the minimum distance between the conductive materials (distance S) which can be processed to form a circuit network, according to the same methods described above.

Then, the dry film was dissolved into the developing solution in such a stepwise manner that the amount of the dry film in the developing solution was increased by 0.08 $m^2$/liter in every addition of the dry film. The measurements and the evaluations described above were conducted after every addition of the dry film according to the same methods as described above.

Results of the measurements and the evaluations are shown in Tables 4, 5 and 6.

The area of the printed circuit board for the treatment was 100 $m^2$ and the pH of water in the first washing tank with water was 8.0.

COMPARATIVE EXAMPLE 3

A printed circuit board was prepared and evaluations were made according to the same process as that in Example 3 except that a 1.0% aqueous solution of sodium carbonate was used in place of the aqueous solution of tetramethylammonium hydroxide. When the amount of the dry film dissolved in the developing solution was increased to more than 0.03 $m^2$/liter, the foaming height of the developing solution in the tank of the developing apparatus exceeded 50 cm and the developing solution overflew out of the developing apparatus. Therefore, the experiment was stopped at this time.

COMPARATIVE EXAMPLE 4

A defoaming agent (a product of Nikka Kagaku Co., Ltd.; W-2369) was added to the developing solution used in Comparative Example 3 in an amount of 0.1% and an exposed board was treated by the same process as that in Example 1. The foaming height of the developing solution and the weight of insoluble substances remaining on the filter paper per 1 liter of the developing solution after the filtration were measured in every step of dissolving the dry film into the developing solution. The finished accuracy of the fine circuit after the exposed board was treated and etched as described above was evaluated by finding the minimum width of the conductive material (width L) and the minimum distance between the conductive materials (distance S) which can be processed to form a circuit network, according to the same methods described above.

Results of the measurements and the evaluations are shown in Tables 4, 5 and 6.

The area of the printed circuit board for the treatment was 100 $m^2$ and the pH of water in the first washing tank with water was 9.5.

TABLE 4

| amount of dissolved | foaming height of developing solution (mm) | | | |
|---|---|---|---|---|
| DFR ($m^2$/liter) | 0 | 0.08 | 0.16 | 0.25 |
| Example 3 | 0 | 6 | — | — |
| Example 4 | 0 | 7 | 8 | 10 |
| Comparative Example 3 | 0 | x | x | x |
| Comparative Example 4 | 0 | 4 | 6 | 15 |

TABLE 5

| amount of dissolved | weight of substances remaining after filtration of developing solution (mg/liter) | | | |
|---|---|---|---|---|
| DFR ($m^2$/liter) | 0 | 0.08 | 0.16 | 0.25 |
| Example 3 | 0 | 100 | — | — |
| Example 4 | 0 | 110 | 160 | 200 |
| Comparative Example 3 | 0 | x | x | x |
| Comparative Example 4 | 0 | 220 | 500 | 1470 |

TABLE 6

| amount of dissolved | | finished accuracy of development (mm) | | | |
|---|---|---|---|---|---|
| DFR ($m^2$/liter) | | 0 | 0.08 | 0.16 | 0.25 |
| Example 3 | width L | 0.075 | 0.075 | — | — |
| | distance S | 0.075 | 0.075 | — | — |
| Example 4 | width L | 0.075 | 0.075 | 0.075 | 0.075 |
| | distance S | 0.075 | 0.075 | 0.075 | 0.075 |
| Comparative Example 3 | width L | 0.075 | x | x | x |
| | distance S | 0.075 | x | x | x |
| Comparative Example 4 | width L | 0.075 | 0.075 | 0.075 | 0.075 |
| | distance S | 0.075 | 0.075 | 0.100 | 0.125 |

EXAMPLE 5

Treatments of an exposed board were conducted in the same conditions as those in Example 3 by using the same mixed solution as that used in Example 4. The development treatment could be continued until the area of the treated printed circuit board reached about 360 $m^2$ and the amount of the dissolved solid substance (the photo-resist) reached 1.2%.

COMPARATIVE EXAMPLE 5

Treatments of an exposed board were conducted in the same conditions as those in Example 3 by using the same mixed solution as that used in Comparative Example 4. The development treatment could be continued until the area of the treated printed circuit board reached about 120 m² and the amount of the dissolved solid substance (the photoresist) reached 0.4%.

What is claimed is:

1. A developing solution for producing printed circuit boards comprising a quaternary ammonium hydroxide represented by the formula: $[(R^1)_3N-R]^+ \cdot OH^-$ wherein R indicates an unsubstituted alkyl group having 1 to 3 carbon atoms or a hydroxy-substituted alkyl group having 1 to 3 carbon atoms, and $R^1$ indicate an alkyl group having 1 to 3 carbon atoms and a quaternary ammonium hydrogen carbonate represented by the formula: $[(R^1)_3N-R]^+ \cdot HCO_3^-$ wherein R indicates an unsubstituted alkyl group having 1 to 3 carbon atoms or a hydroxy-substituted alkyl group having 1 to 3 carbon atoms, and $R^1$ indicates an alkyl group having 1 to 3 carbon atoms.

2. A developing solution for producing printed circuit boards according to claim 1, wherein the quaternary ammonium hydroxide is comprised in an amount of 0.2 to 3.0% by weight, the quaternary ammonium hydrogen carbonate is comprised in an amount by mol equal to or more than the amount by mol of the quaternary ammonium hydroxide, and pH of the developing solution has a pH of 9 to 13.

3. A developing solution for producing printed circuit boards according to claim 1, wherein the quaternary ammonium hydrogen carbonate is tetramethylammonium hydrogen carbonate or trimethyl(2-hydroxyethyl)ammonium hydrogen carbonate.

4. A developing solution for producing printed circuit boards according to claim 2, wherein the quaternary ammonium hydrogen carbonate is tetramethylammonium hydrogen carbonate or trimethyl(2-hydroxyethyl)ammonium hydrogen carbonate.

5. A process for producing a printed circuit board comprising (a) adhering a photo-curing resist on a board, (b) exposing the resist to ultraviolet light through a photomask, (c) developing the exposed resist by applying an organic alkali solution excluding a defoaming agent, the organic alkali solution comprising (i) a quaternary ammonium hydroxide represented by the formula: $((R^1)_3N-R)^+ \cdot OH^-$ and (ii) a quaternary ammonium hydrogen carbonate represented by the formula: $((R^1)_3N-R)^+ \cdot HCO_3^-$ wherein R is an alkyl unsubstituted group having 1 to 3 carbon atoms or a hydroxy-substituted alkyl group having 1 to 3 carbon atoms, and $R^1$ is an alkyl group having 1 to 3 carbon atoms, and (d) forming a circuit.

6. A process for producing a printed circuit board comprising (a) adhering a resist of a photo-curing type on a board, (b) exposing the resist to ultraviolet light through a photomask, (c) developing the exposed resist by applying an organic alkali solution excluding a defoaming agent, and the organic alkali solution comprising (i) a quaternary ammonium hydroxide represented by the formula: $((R^1)_3N-R)^+ \cdot OH^-$ and (ii) an ammonium hydrogen carbonate represented by the formula: $((R^1)_3N-R)^+ \cdot HCO_3^-$, wherein R is an unsubstituted alkyl group having 1 to 3 carbon atoms or a hydroxy-substituted alkyl group having 1 to 3 carbon atoms, and $R^1$ is an alkyl group having 1 to 3 carbon atoms and (d) forming an electric or electronic circuit by electric plating.

7. A process for producing a printed circuit board comprising (a) adhering a resist of a photo-curing type on a board, (b) exposing the resist to ultraviolet light through a photomask, (c) developing the exposed resist by applying an organic alkali solution excluding a defoaming agent, the organic alkali solution comprising (i) a quaternary ammonium hydroxide represented by the formula: $((R^1)_3N-R)^+ \cdot OH^-$ and (ii) a quaternary ammonium hydrogen carbonate represented by the formula: $((R^1)_3N-R)^+ \cdot HCO_3^-$, wherein R is an unsubstituted alkyl group having 1 to 3 carbon atoms or a hydroxy-substituted alkyl group having 1 to 3 carbon atoms, and $R^1$ and (d) forming an etching resist circuit.

8. A process for producing a printed circuit board comprising (a) adhering a photo-curing resist on a board, the desist comprising a (polyfunctional) acrylate compound having an acryloyl group or a (polyfunctional) methacrylate compound having a methacryloyl group as a polymerizable monomer and a copolymer composition containing an acrylic copolymer and a copolymer having a caraboxyic group as a binder, (b) exposing the resist to ultraviolet light through a photomask, (c) developing the exposed resist by a developing solution excluding a defoaming agent, the developing solution comprising a quaternary ammonium hydroxide represented by the formula: $((R^1)_3N-R)^+ \cdot OH^-$ wherein R is an unsubstituted alkyl group having 1 to 3 carbon atoms or a hydroxy-substituted alkyl group having 1 to 3 carbon atoms, and $R^1$ is an alkyl group having 1 to 3 carbon atoms, wherein the quaternary ammonium hydroxide is in an amount of 0.05 to 1.0% by weight and has a pH of 9 to 13 and (d) forming a circuit.

9. The process according to claim 8, wherein the circuit is an electric or electronic circuit provided by electric plating.

10. The process according to claim 8, wherein the circuit is an etching resist circuit.

11. The process according to claim 8, wherein the quaternary ammonium hydroxide is tetramethylammonium hydroxide or trimethyl-(2-hydroxyethyl)ammonium hydroxide.

12. The process according to claim 5, wherein the quaternary ammonium hydroxide is in an amount of 0.2 to 3.0% by weight, the quaternary ammonium hydrogen carbonate is in a molar amount equal to or more than the amount by moles of the quaternary ammonium hydroxide, and the developing solution has a pH of 9 to 13.

13. The process according to claim 5, wherein the quaternary ammonium hydrogen carbonate is tetramethylammonium hydrogen carbonate or trimethyl(2-hydroxyethyl)ammonium hydrogen carbonate.

14. The process according to claim 12, wherein the quaternary ammonium hydrogen carbonate is tetramethylammonium hydrogen carbonate or trimethyl(2-hydroxethyl)ammonium hydrogen carbonate.

* * * * *